US011231820B1

(12) United States Patent
Jaw et al.

(10) Patent No.: US 11,231,820 B1
(45) Date of Patent: Jan. 25, 2022

(54) TOUCH SENSING STRUCTURE, AND ELECTRONIC DEVICE USING SAME

(71) Applicants: Interface Technology (ChengDu) Co., Ltd., Chengdu (CN); INTERFACE OPTOELECTRONICS (SHENZHEN) CO., LTD., Shenzhen (CN); INTERFACE OPTOELECTRONICS (WUXI) CO., LTD., Nuxi (CN); GENERAL INTERFACE SOLUTION LIMITED, Zhunan (TW)

(72) Inventors: Ten-Hsing Jaw, Zhubei (TW); I-Chang Kuan, Zhunan (TW); Han-Lung Tsai, Hsinchu (TW)

(73) Assignees: Interface Technology (ChengDu) Co., Ltd., Chengdu (CN); INTERFACE OPTOELECTRONICS (SHENZHEN) CO., LTD., Shenzhen (CN); INTERFACE OPTOELECTRONICS (WUXI) CO., LTD., Wuxi (CN); GENERAL INTERFACE SOLUTION LIMITED, Zhunan (TW)

( * ) Notice: Subject to any disclaimer, the term of this patent is extended or adjusted under 35 U.S.C. 154(b) by 0 days.

(21) Appl. No.: 17/228,958

(22) Filed: Apr. 13, 2021

(30) Foreign Application Priority Data

Jan. 12, 2021 (CN) .......................... 202110037819.5

(51) Int. Cl.
*G06F 3/044* (2006.01)

(52) U.S. Cl.
CPC .... *G06F 3/044* (2013.01); *G06F 2203/04105* (2013.01)

(58) Field of Classification Search
CPC ...... G06F 3/041; G06F 1/1626; G06F 3/0412; G06F 3/044; G06F 2203/04105
See application file for complete search history.

(56) References Cited

U.S. PATENT DOCUMENTS

| 2008/0230283 | A1* | 9/2008 | Yoon | G06F 3/0202 |
| | | | | 178/18.11 |
| 2014/0126177 | A1* | 5/2014 | Geyl | H03K 17/9625 |
| | | | | 362/23.05 |
| 2020/0387279 | A1* | 12/2020 | Kim | G06F 3/0412 |
| 2021/0064156 | A1* | 3/2021 | Ho | G02B 6/0036 |
| 2021/0074690 | A1* | 3/2021 | Lee | H01L 25/0753 |

* cited by examiner

*Primary Examiner* — Hong Zhou
(74) *Attorney, Agent, or Firm* — ScienBiziP, P.C.

(57) ABSTRACT

A touch sensing structure with improved illumination includes a first substrate, a decoration layer, a light-shielding layer, a light-emitting element, a pressure-sensitive element, a first reflective layer, and a second reflective layer. The pressure-sensitive element is farther away than the light-emitting element from the first substrate. The decoration layer shows a function icon. The light-emitting element emits light to illuminate the function icon. When the first substrate is pressed, the touch sensing structure determines a magnitude of the pressing force by detecting a change in the resistance or voltage value of the pressure-sensitive element. If the pressing force reaches a specific value, the function identified by the function icon is executed, otherwise no function is executed.

20 Claims, 9 Drawing Sheets

TOUCH SENSING STRUCTURE, AND ELECTRONIC DEVICE USING SAME

FIELD

The subject matter herein generally relates to human-computer interaction devices, specifically a touch sensing structure, and an electronic device using the touch sensing structure.

BACKGROUND

Piezoresistive materials can be used in touch sensing structures such as buttons.

Generally, the button includes a transparent substrate, a piezoresistive material layer, and, for indicating location, a light-emitting element stacked in said order. An icon is defined on the substrate to identify a function of the button. However, since the piezoresistive material layer is non-transparent, the light-emitting element is partly shielded and obscured by the piezoresistive material layer, so that when the icon is illuminated, a shape of the piezoresistive material layer can be observed on the button, which affects the use of the button.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1:
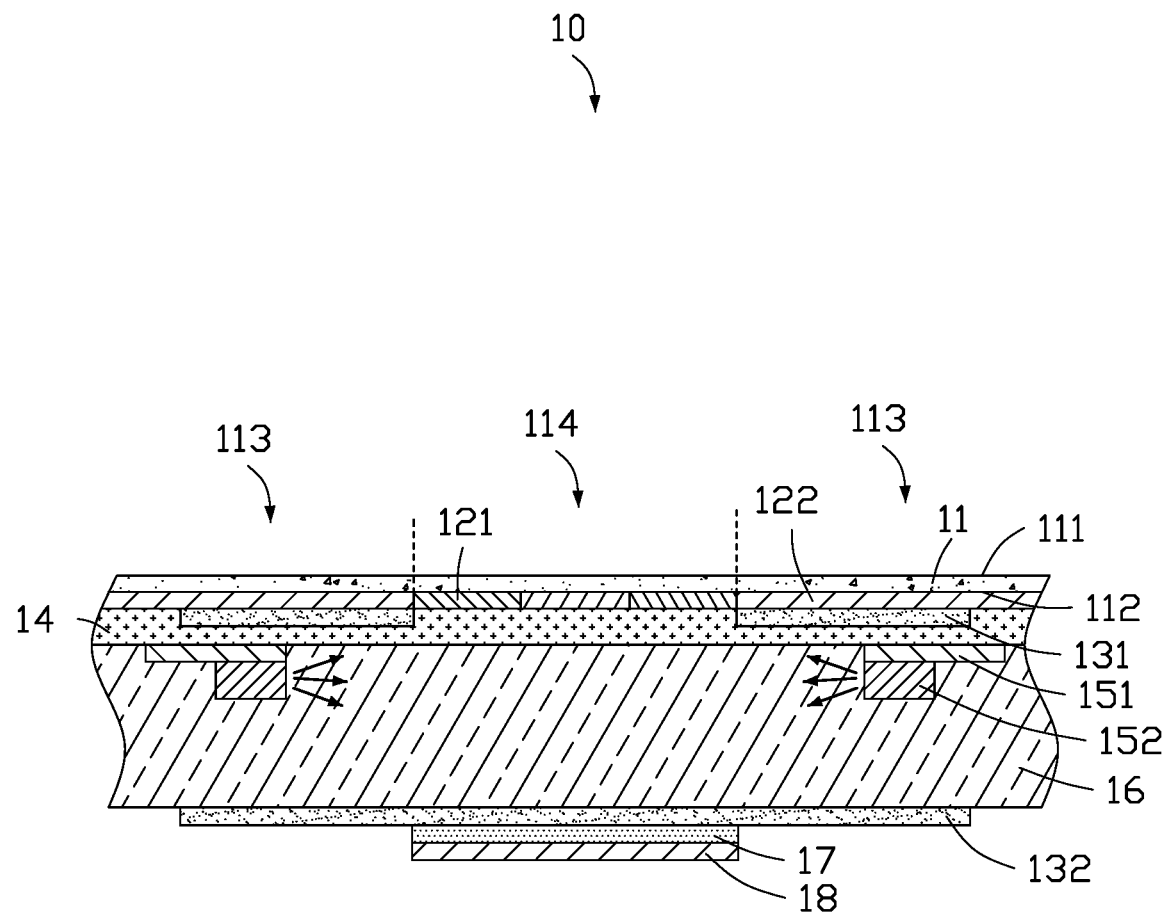
FIG. 1 is a cross-sectional view of a touch sensing structure according to a first embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one".

FIG. 1 shows a touch sensing structure 10 according to a first embodiment. The touch sensing structure 10 includes a first substrate 11, a decoration layer 121, a light-shielding layer 122, a light-emitting element 152, a pressure-sensitive element 18, a first reflective layer 131 and a second reflective layer 132. The first substrate 11 has a first surface 111 and a second surface 112 opposite to each other. The first surface 111 is a pressure-sensitive interface, which can be pressed by a user. Both the decoration layer 121 and the light-shielding layer 122 are on the second surface 112. The light-emitting element 152 is on a side of the light-shielding layer 122 away from the first substrate 11. The pressure-sensitive element 18 is on a side of the decoration layer 121 away from the first substrate 11. The pressure-sensitive element 18 is farther away than the light-emitting element 152 from the first substrate 11. The first reflective layer 131 is between the light-shielding layer 122 and the light-emitting element 152. The second reflective layer 132 is between the light-emitting element 152 and the pressure-sensitive element 18.

The first substrate 11 defines a light-transmitting area 114 and a light-shielding area 113 at a periphery of the light-transmitting area 114. The decoration layer 121 and the pressure-sensitive element 18 are in the light-transmitting area 114. The light-shielding layer 122, the first reflective layer 131, and the light-emitting element 152 are in the light-shielding area 113. The second reflective layer 132 is in the light-transmitting area 114 and the light-shielding area 113. The decoration layer 121 defines a function icon 123 (shown in FIG. 3) associated with a function. The function icon 123 may be a symbol that refers to a certain function. The light-emitting element 152 emits light to illuminate the function icon 123. When the first substrate 11 is pressed, the touch sensing structure 10 determines a magnitude of the pressing force received by the pressure-sensitive element 18, by detecting a change in resistance or voltage value of the pressure-sensitive element 18. If the pressing force is greater than a specific value, the function associated with the function icon 123 is executed, otherwise, the function is not executed. In the touch sensing structure 10, the pressure-sensitive element 18 is activated only when the pressing force reaches the specific value, which resolves problems of mistouches or accidental touches. The mistouch includes not only a slight pressing with a small pressure in the light-transmitting area 114, but also an abnormal pressing force outside the light-transmitting area 114.

In one embodiment, the light emitted by the light-emitting element 152 passes through the light-transmitting area 114 to indicate and guide the user to press the position of the first surface 111 of the first substrate 11 corresponding to the pressure-sensitive element 18. Thereby, when the pressing force is greater than the specific value, the function associated with the function icon 123 is executed. In other embodiments, the light-emitting element 152 can be activated after the user presses the light-transmitting area 114, and the emitted light, illuminating the light-transmitting area 114, can indicate a successful press. The touch sensing structure 10 can be a button.

In the touch sensing structure 10, the light-emitting element 152 is in the light-shielding area 113, and the pressure-sensitive element 18 is in the light-transmitting area 114, so that along a thickness direction of the touch sensing structure 10, a projection of the light-emitting element 152 and a projection of the pressure-sensitive element 18 18 do not overlap with each other. The pressure-sensitive element 18 is farther away than the light-emitting element 152 from the first substrate 11, so that the light emitted by the light-emitting element 152 is not shielded by the pressure-sensitive element 18. In addition, the first reflective layer 131 is in the light-shielding area 113, so that most of the light emitted by the light-emitting element 152 is reflected to the light-transmitting area 114 after passing through the first reflective layer 131, which improves illumination brightness of the function icon 123. Moreover, the second reflective layer 132 is between the light-emitting element 152 and the pressure-sensitive element 18. The second reflective layer 132 is in the light-transmitting area 114 and the light-shielding area 113, so that the pressure-sensitive element 18 is completely covered by the second reflective layer 132. The light emitted by the light-emitting element 152 is reflected away from the pressure-sensitive element 18 after passing through the second reflective layer 132. Thus, a shielding effect of the pressure-sensitive element 18 and user-experience of the touch sensing structure 10 are further improved.

In one embodiment, a material of the first substrate 11 may be, but is not limited to, polycarbonate (PC), polyethylene terephthalate (PET), and polymethyl methacrylate (PMMA), polyimide (PI), or Acrylonitrile Butadiene Styrene (ABS).

Figure 3:
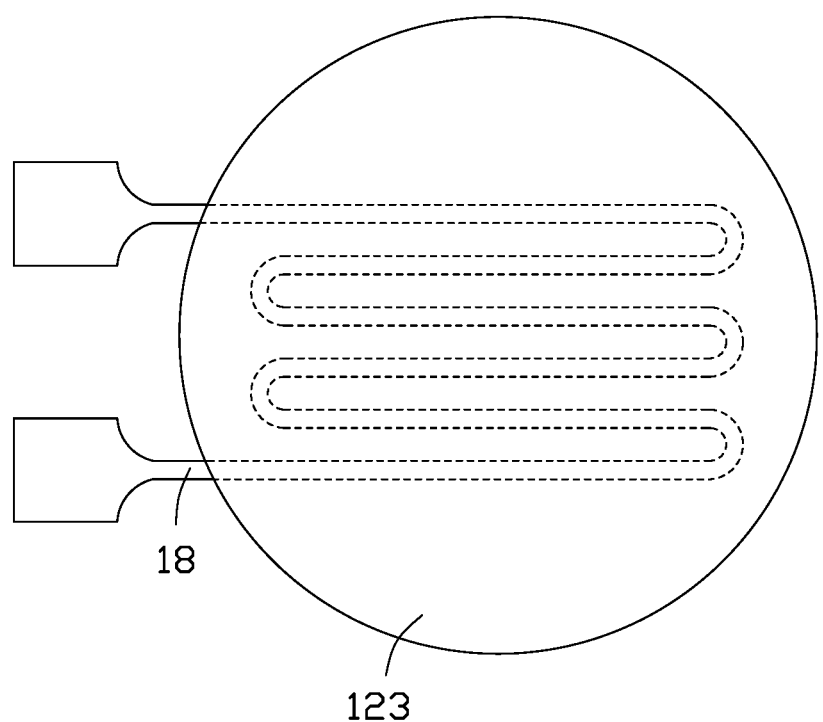
FIG. 3 is a plan view of the touch sensing structure in FIG. 1.

In one embodiment, a material of the decoration layer 121 is a transparent ink with colors (e.g., red, green, and blue). A material of the light-shielding layer 122 is opaque ink. Both the decoration layer 121 and the light-shielding layer 122 are formed on the first substrate 11 through processes such as printing or coating. The light-shielding layer 122 surrounds the light-transmitting area 114 and defines an opening. The decoration layer 121 is in the light-transmitting area 114 and fills the opening. The function icon 123 may be a shape of the opening defined by the light-shielding layer 122 or may be a pattern formed by the decoration layer 121. In FIG. 3, the function icon 123 is circular. In one embodiment, the light-emitting element 152 emits white light, and the decoration layer 121 is made of a colored ink. The colored ink defines the function icon 123. When white light is incident on the decoration layer 121, the light-transmitting area 114 displays the function icon 123s as being composed of the colored ink.

In FIG. 1, the touch sensing structure 10 includes a light guide layer 16, an insulating layer 14 and a trace layer 151. The light-emitting element 152 and the trace layer 151 are embedded in the light guide layer 16 and are in the light-shielding area 113. The light-emitting element 152 is electrically connected to the trace layer 151. The insulating layer 14 is transparent. The insulating layer 14 is between the first substrate 11 and the light guide layer 16 and covers the decoration layer 121, the light-shielding layer 122, and the first reflective layer 131. The second reflective layer 132 is on a surface of the light guide layer 16 away from the first substrate 11. The pressure-sensitive element 18 is adhered to the surface of the second reflective layer 132 away from the first substrate 11 through an adhesive layer 17.

In one embodiment, the first reflective layer 131 is made of metal and is coated on the light-shielding layer 122. The first reflective layer 131 and the trace layer 151 are insulated from each other by the insulating layer 14. In other embodiments, the first reflective layer 131 may be made of a non-metallic material, and the insulating layer 14 can be omitted. For example, the first reflective layer 131 may be ink, which can be printed on the light-shielding layer 122.

In one embodiment, the light guide layer 16 is configured to guide the light emitted by the light-emitting element 152 and is made of resin. For example, a material of the light guide layer 16 may be, but is not limited to, PMMA or PC. The light-emitting element 152 is in the light guide layer 16 instead of being suspended in air. Thereby, the light emitted by the light-emitting element 152 is not dispersed and lost all around.

In one embodiment, the light-emitting element 152 is a light-emitting diode. In FIG. 1, the light-emitting element 152 is a side-emitting light-emitting diode, the arrow in FIG. 1 shows the direction of light emitted by the light-emitting element 152. The light-emitting element 152 can be electrically connected to a flexible circuit board (not shown) through the trace layer 151 and emit light under the driving of the flexible circuit board. In addition, along the thickness direction of the touch sensing structure 10, the projection of the light-shielding layer 122 completely covers the first reflective layer 131, the trace layer 151, and the light-emitting element 152, so that the first reflective layer 131, the trace layer 151, and the light-emitting element 152 are not observable by the user.

In one embodiment, the second reflective layer 132 is made of metal and is formed on the surface of the light guide layer 16 away from the first substrate 11 by coating. In other embodiments, the second reflective layer 132 may be made of a non-metallic material, such as ink, and be formed on the surface of the light guide layer 16 away from the first substrate 11 by printing.

In one embodiment, a method for making the touch sensing structure 10 includes forming the light-shielding layer 122, the decoration layer 121, and the insulating layer 14 sequentially on the first substrate 11. Then, the trace layer 151 and the light-emitting element 152 are formed on the insulating layer 14, and the light guide layer 16 is formed by using in-mold electronics (IME) technology. The light guide layer 16 wraps the light-emitting element 152 and the trace layer 151. Then, the second reflective layer 132 is formed on the surface of the light guide layer 16 away from the first substrate 11, and the pressure-sensitive element 18 is bonded to the second reflective layer 132 through the adhesive layer 17.

Figure 2:
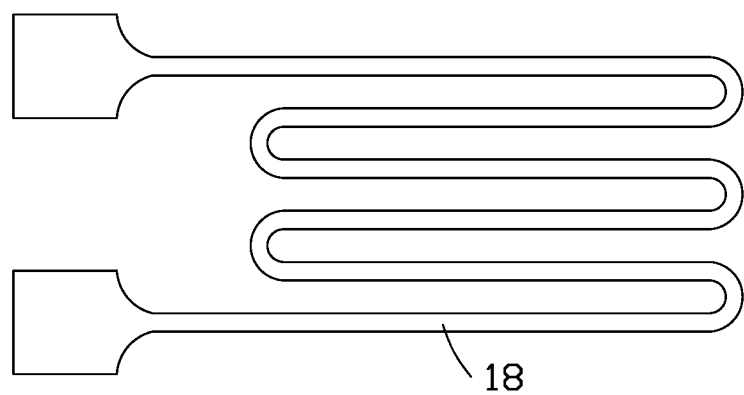
FIG. 2 is a plan view of a pressure-sensitive element of the structure in FIG. 1.

In one embodiment, the pressure-sensitive element 18 is a semiconductor material with piezoresistive qualities, which can convert stress into an electrical signal, and its resistance value changes with the magnitude of the stress. As shown in FIG. 2, the pressure-sensitive element 18 has a bent and extended strip structure. When the pressure-sensitive element 18 is pressed, the resistance value of the pressure sensitive element 18 changes.

In one embodiment, the first substrate 11 and the light guide layer 16 are made of flexible materials, so that the pressing force applied to the pressure-sensitive element 18 is passed on without affecting a sensitivity of the pressure-sensitive element 18. The pressure-sensitive element 18 is bonded to the light guide layer 16 through the adhesive layer 17, the adhesive layer 17 functions as an adhesive and insulation, the adhesive layer 17 may fill gaps between adjacent strips.

In FIG. 1, there are seen a plurality of light-emitting elements 152. The light emitted by the light-emitting elements 152 propagates through the light guide layer 16 and is reflected by the first reflective layer 131 or the second reflective layer 132, thereby changing propagation direction of the light emitted by the light-emitting elements 152. The light emitted by the light-emitting element 152 irradiates the light-transmitting area 114. Thus, the brightness of the light-transmitting area 114 is increased. In addition, since the pressure-sensitive element 18 is below the light-emitting element 152, along the thickness direction of the touch sensing structure 10, the projection of the light-emitting element 152 on the first substrate 11 and the projection of the pressure-sensitive element 18 on the first substrate 11 are staggered, so that the light emitted by the light-emitting elements 152 is not shielded by the pressure-sensitive element 18. As shown in FIG. 3, in the light-transmitting area 114, the pressure-sensitive element 18 cannot be seen by the user.

In some embodiments, the pressure-sensitive element 18 includes a piezoelectric material layer. The piezoelectric material layer converts stress into an electrical signal (e.g., a voltage), and the voltage value of the piezoelectric material changes with the magnitude of the stress. When the pressure-sensitive element 18 is pressed, the voltage value of the pressure-sensitive element 18 changes. The piezoelectric material layer may be a polymer piezoelectric material such as polyvinylidene fluoride-trifluoro ethylene (PVDF-TrFE) copolymer, polyvinylidene fluoride, polyvinylidene fluoride-tetrafluoroethylene copolymer, and other piezoelectric materials.

Figure 4:
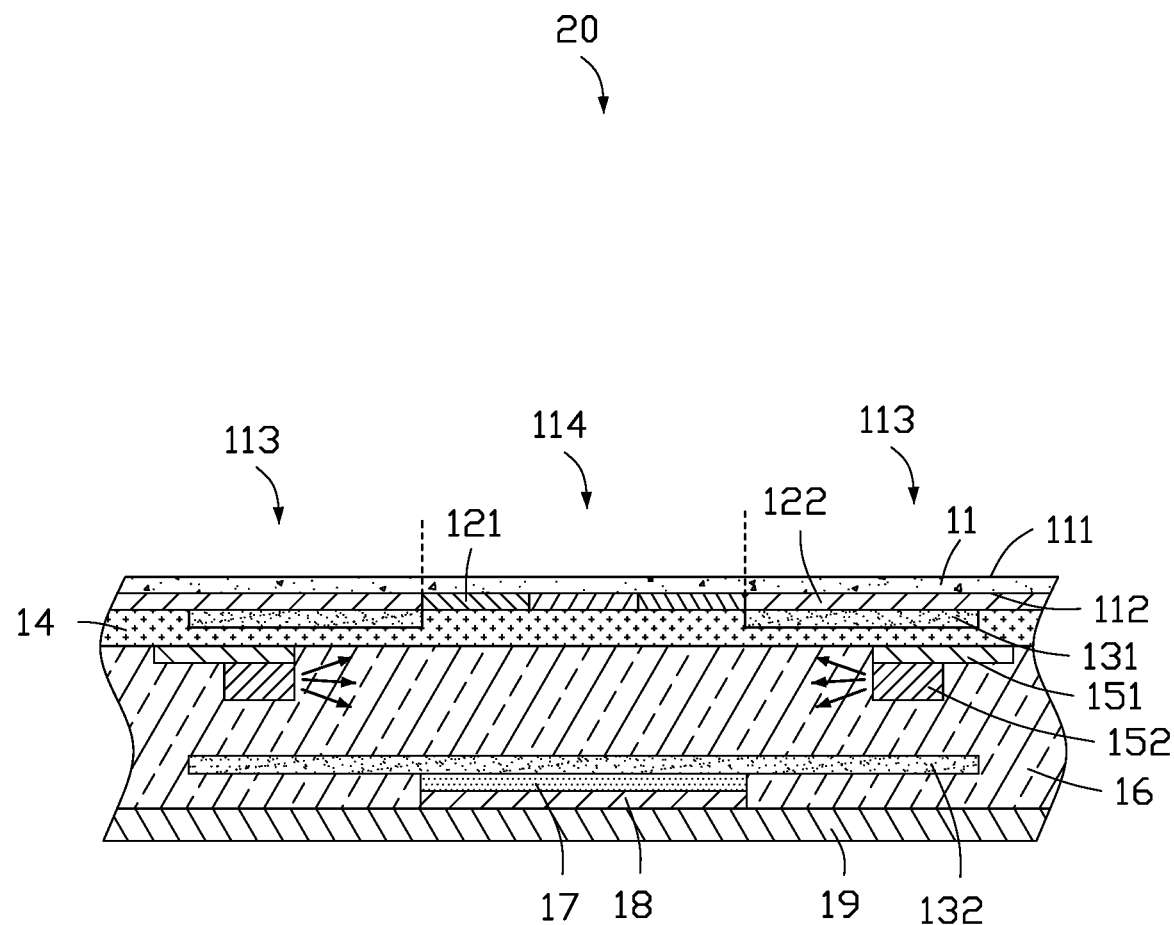
FIG. 4 is a cross-sectional view of the touch sensing structure according to a second embodiment.

FIG. 4 shows a touch sensing structure 20 according to a second embodiment. The difference between the touch sensing structure 20 and the touch sensing structure 10 is that the touch sensing structure 20 further includes a second substrate 19. The second substrate 19 is on a side of the light guide layer 16 away from the first substrate 11, and the second reflective layer 132 and the pressure-sensitive element 18 are both in the light guide layer 16. A material of the second substrate 19 and a material of the first substrate 11 may be the same or different. The material of the second substrate 19 and the material of the first substrate 11 may be, but is not limited to PC, PET, PMMA, PI, or ABS. The second reflective layer 132 may be formed by printing, coating, or bonding. The light guide layer 16 and the second substrate 19 are connected by an injection process.

Figure 5:
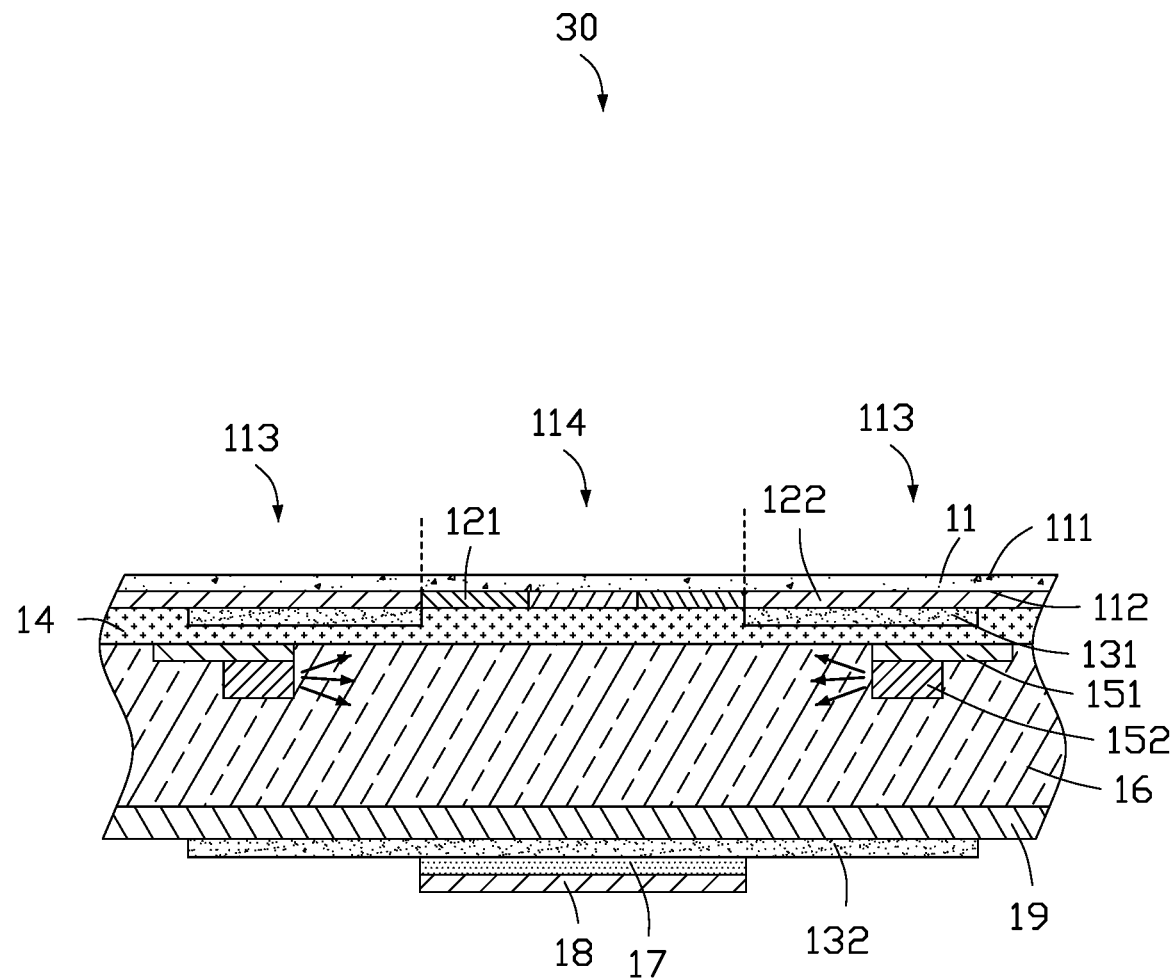
FIG. 5 is a cross-sectional view of the touch sensing structure according to a third embodiment.

FIG. 5 shows a touch sensing structure 30 according to a third embodiment. The difference between the touch sensing structure 30 and the touch sensing structure 10 is that the touch sensing structure 30 further includes a second substrate 19. The second substrate 19 is on a side of the light guide layer 16 away from the first substrate 11. The second reflective layer 132 and the pressure-sensitive element 18 are on the side of the second substrate 19 away from the light guide layer 16. A trace (not shown) electrically connected to the pressure-sensitive element 18 is on the second substrate 19. The material of the second substrate 19 and the material of the first substrate 11 may be the same or different, and may be, but is not limited to, PC, PET, PMMA, PI, or ABS. The second reflective layer 132 may be formed by printing, coating, or bonding. The light guide layer 16 and the second substrate 19 are connected by an injection process.

Figure 6:
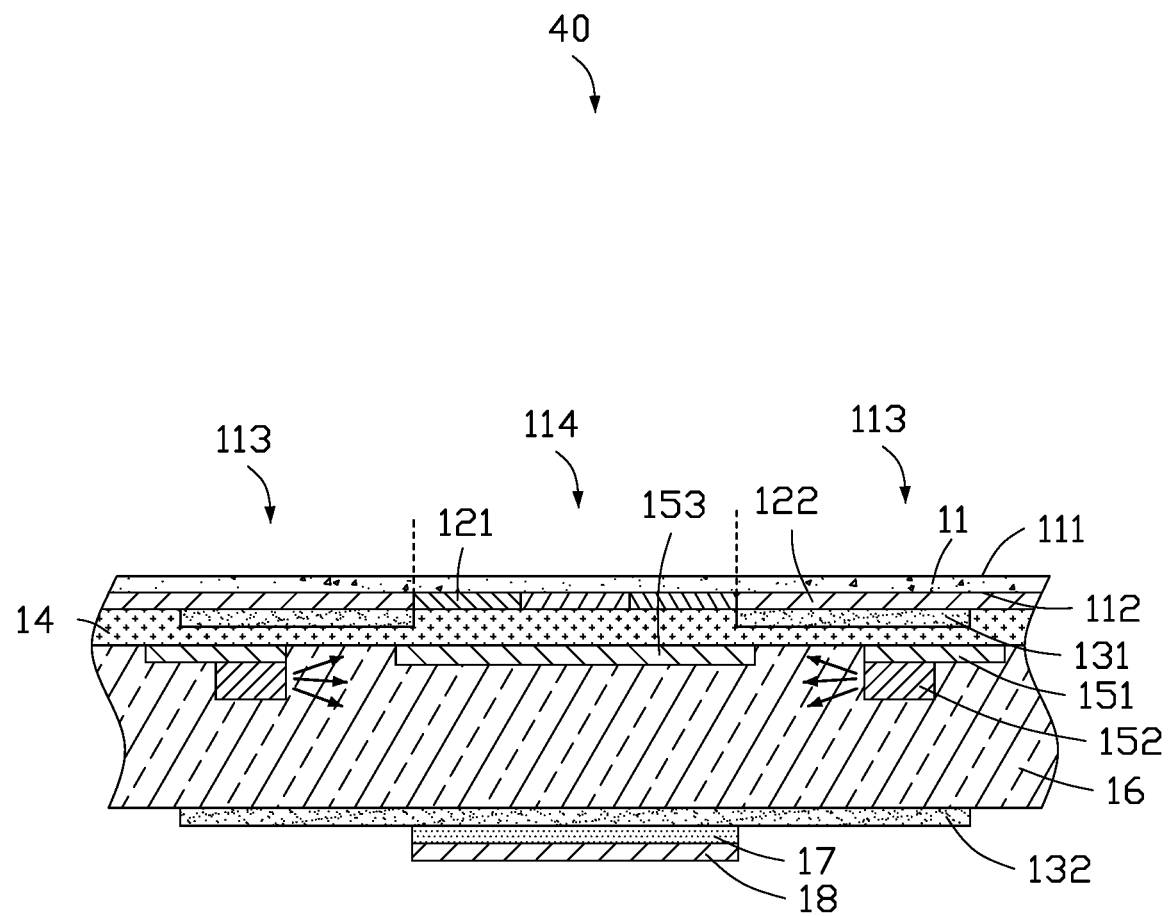
FIG. 6 is a cross-sectional view of the touch sensing structure according to a fourth embodiment.

FIG. 6 shows a touch sensing structure 40 according to a fourth embodiment. The difference between the touch sensing structure 40 and the touch sensing structure 10 is that the touch sensing structure 40 further includes a touch element 153 for detecting locations of touches. The touch element 153 is above the pressure-sensitive element 18. A second reflective layer 132 is sandwiched between the touch element 153 and the pressure-sensitive element 18. The touch element 153 is in the light-transmitting area 114 and is on a surface of the insulating layer 14 away from the second surface 112. A projection of the touch element 153 on the first substrate 11 corresponds to a projection of the pressure-sensitive element 18 on the first substrate 11.

In FIG. 6, the touch element 153 is in the light guide layer 16. The light guide layer 16, the second reflective layer 132, and the glue layer 17 are sandwiched between the touch element 153 and the pressure-sensitive element 18. In a manufacturing process, the touch element 153 can be formed on the insulating layer 14 in the step of forming the trace layer 151 and the light-emitting element 152 on the insulating layer 14. Then, the light guide layer 16 is formed using IME technology, and the light guide layer 16 wraps the light-emitting element 152, the trace layer 151, and the touch element 153.

In one embodiment, the touch element 153 is a capacitive element, which senses the change in capacitance caused by a touch and so calculates the position of the touch point. In addition, the touch element 153 is above the pressure-sensitive element 18, thus even if there is another film layer sandwiched between the touch element 153 and the pressure-sensitive element 18, it will not interfere with the signal sensing in the touch element 153.

Figure 7:
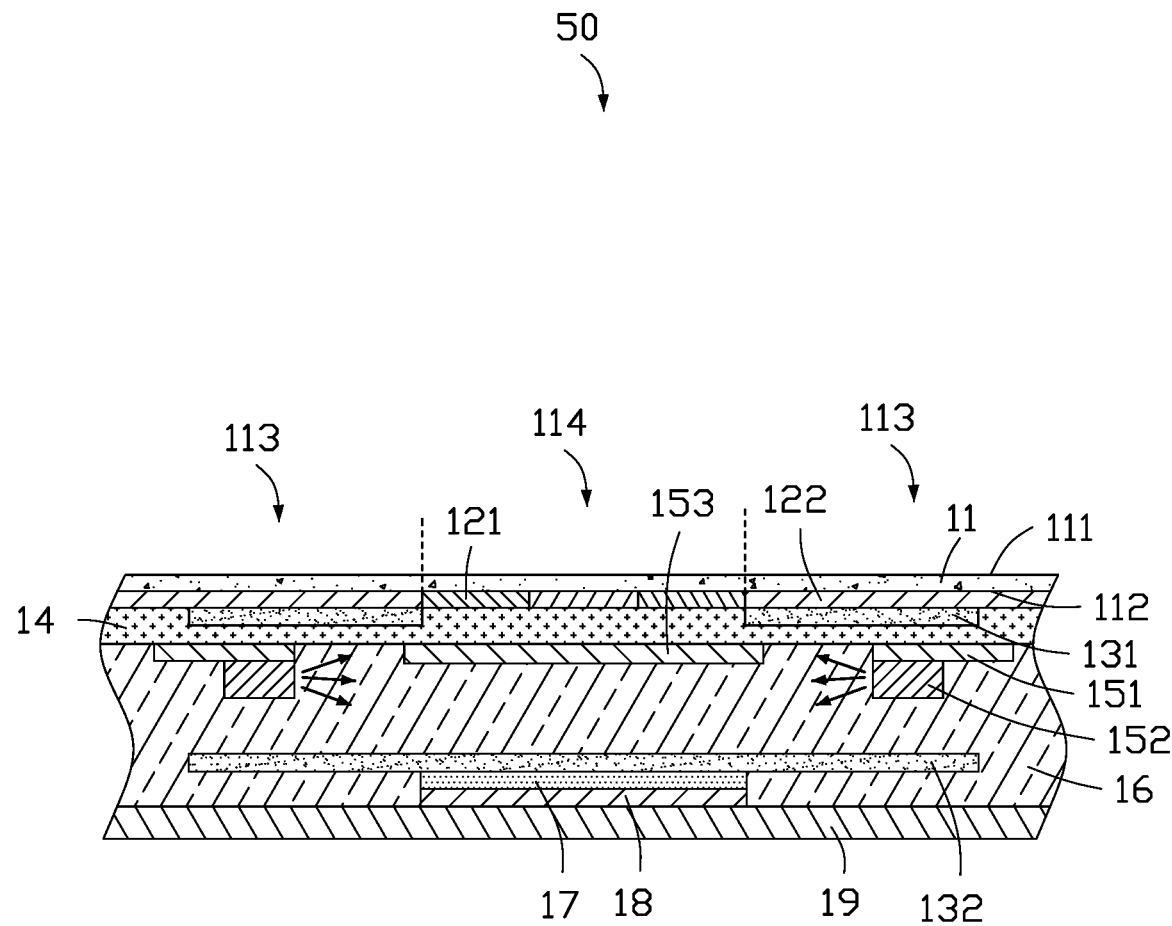
FIG. 7 is a cross-sectional view of the touch sensing structure according to a fifth embodiment.

FIG. 7 shows a touch sensing structure 50 according to a fifth embodiment. The difference between the touch sensing structure 50 and the touch sensing structure 20 is that the touch sensing structure 50 further includes a touch element 153 for detecting locations of touches. The touch element 153 is above the pressure-sensitive element 18. The second reflective layer 132 is sandwiched between the touch element 153 and the pressure-sensitive element 18. The touch element 153 is in the light-transmitting area 114 and is on the surface of the insulating layer 14 away from the second surface 112. A projection of the touch element 153 on the first substrate 11 corresponds to the projection of the pressure-sensitive element 18 on the first substrate 11.

In FIG. 7, the touch element 153 is in the light guide layer 16. The light guide layer 16, the second reflective layer 132, and the glue layer 17 are between the touch element 153 and the pressure-sensitive element 18. In the manufacturing process, the touch element 153 can be formed on the insulating layer 14 in the step of forming the trace layer 151 and the light-emitting element 152 on the insulating layer 14. Then, the light guide layer 16 is formed using IME technology, and the light guide layer 16 wraps the light-emitting element 152, the trace layer 151, and the touch element 153.

In one embodiment, the touch element 153 is a capacitive element, calculating the position of the touch point by sensing a change in capacitance. In addition, the touch element 153 is above the pressure-sensitive element 18, so even if another film layer is sandwiched between the two, the signal sensing in the touch element 153 is not affected.

Figure 8:
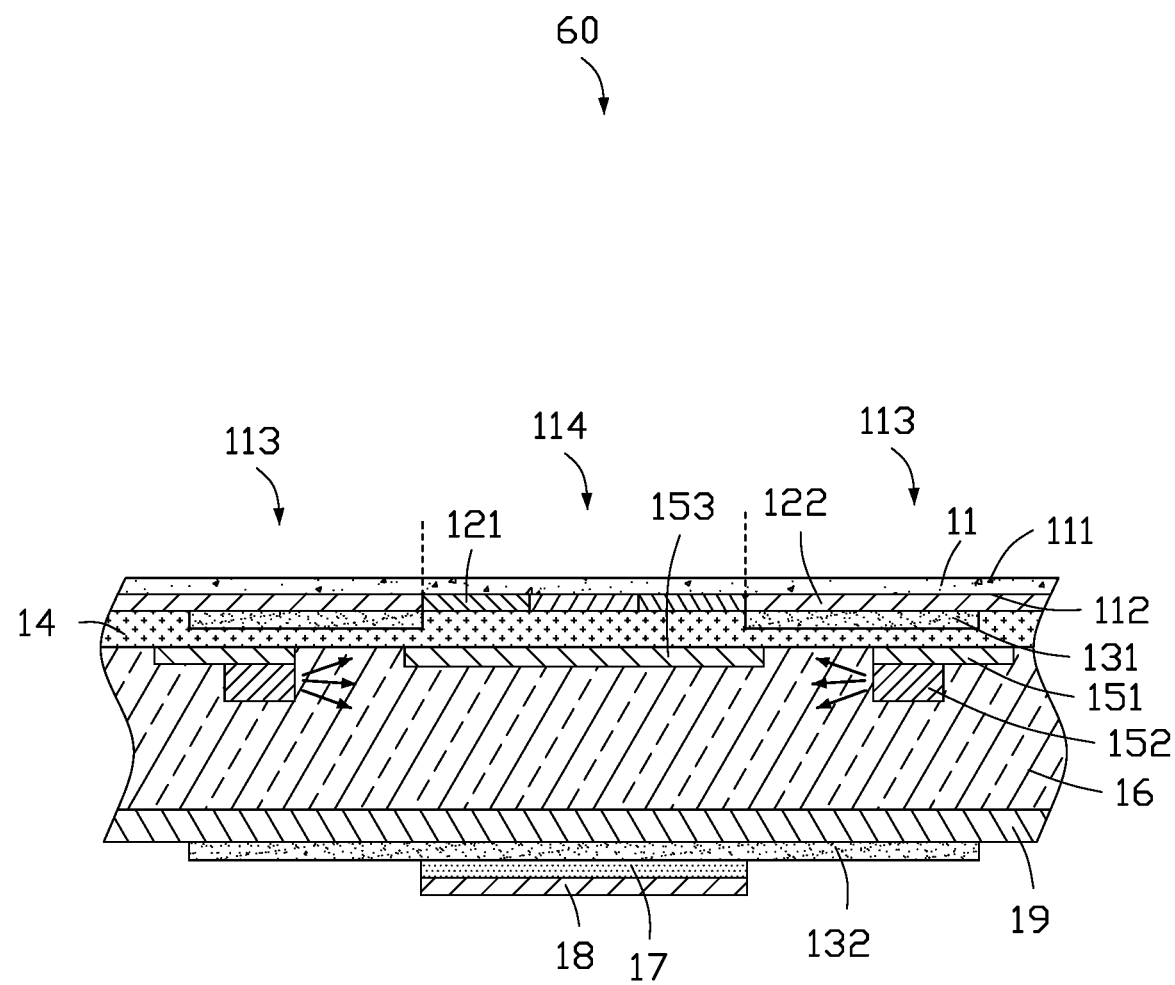
FIG. 8 is a cross-sectional view of the touch sensing structure according to a sixth embodiment.

FIG. 8 shows a touch sensing structure 60 according to a sixth embodiment. The difference between the touch sensing structure 60 and the touch sensing structure 30 is that the touch sensing structure 60 further includes a touch element 153 for detecting locations of touches.

In one embodiment, the touch element 153 is a capacitive element, which calculates the position of the touch point by sensing the change of capacitance. In addition, the touch element 153 is above the pressure-sensitive element 18, so even if another film layer is sandwiched between the two, it will not interfere with the signal sensing in the touch element 153.

Figure 9:
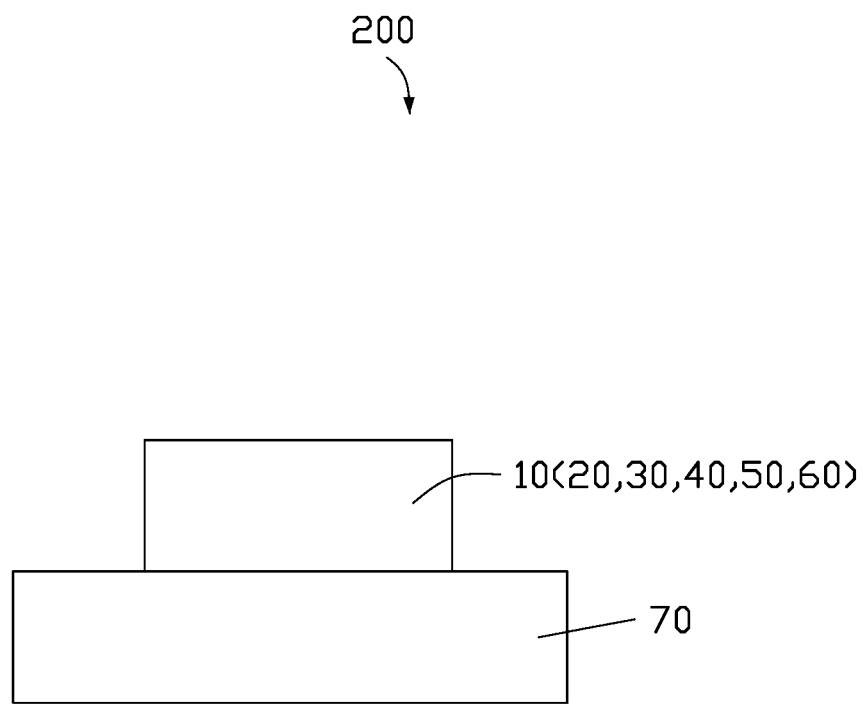
FIG. 9 is a structural diagram of an electronic device according to an embodiment.

FIG. 9 shows an electronic device 100. The electronic device 100 includes a main body 70 and touch sensing structure 10 (or 20, 30, 40, 50, or 60) on the main body 70. The touch sensing structure 10 may be a button. When the touch sensing structure 10 is pressed, the electronic device 100 cooperates to perform the function associated with the function icon 123. In one embodiment, the electronic device 100 may be a gamepad.

In other embodiments, the electronic device 100 may be a self-service terminal, or a household device such as a refrigerator or oven. Since the electronic device 100 includes the touch sensing structure 10, a better user-experience is provided by the electronic device 100.

It should be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A touch sensing structure, comprising:
   a first substrate, the first substrate defining a light-transmitting area and a light-shielding area at a periphery of the light-transmitting area, the first substrate having a first surface and a second surface opposite to the first surface;
   a decoration layer on the second surface and in the light-transmitting area, the decoration layer defining a function icon associated with a function;
   an opaque light-shielding layer on the second surface and in the light-shielding area;
   a light-emitting element on a side of the light-shielding layer away from the second surface and in the light-shielding area, the light-emitting element being configured to emit light to illuminate the function icon;
   a pressure-sensitive element on a side of the decoration layer away from the second surface and in the light-transmitting area, the pressure-sensitive element being farther away than the light-emitting element from the first substrate;
   a first reflective layer between the light-shielding layer and the light-emitting element, and in the light-shielding area; and
   a second reflective layer between the light-emitting element and the pressure-sensitive element;
   wherein the touch sensing structure is configured to determine a magnitude of a pressing force received by the pressure-sensitive element, by detecting a change in resistance or voltage value of the pressure-sensitive element when the first substrate is pressed; and
   wherein the touch sensing structure is configured to execute the function associated with the function icon when the pressing force is greater than a specific value and otherwise not execute the function associated with the function icon.

2. The touch sensing structure of claim 1, further comprising a light guide layer, wherein the light-emitting element is in the light guide layer.

3. The touch sensing structure of claim 2, further comprising a trace layer, wherein the trace layer is embedded in the light guide layer and in the light-shielding area, and the light-emitting element is electrically connected to the trace layer.

4. The touch sensing structure of claim 2, further comprising a transparent insulating layer, wherein the insulating layer is between the first substrate and the light guide layer and covers the decoration layer, the light-shielding layer and the first reflective layer.

5. The touch sensing structure of claim 2, wherein the pressure-sensitive element is adhered to a surface of the second reflective layer away from the second surface.

6. The touch sensing structure of claim 5, wherein the second reflective layer is on a surface of the light guide layer away from the second surface and is opposite to the first reflective layer.

7. The touch sensing structure of claim 5, further comprising a second substrate, wherein the second substrate is on a side of the light guide layer away from the second surface.

8. The touch sensing structure of claim 7, wherein the pressure-sensitive element is on the second substrate, and a trace electrically connected to the pressure-sensitive element is on the second substrate.

9. The touch sensing structure of claim 8, wherein the second reflective layer and the pressure-sensitive element are both in the light guide layer.

10. The touch sensing structure of claim 8, wherein the second reflective layer and the pressure-sensitive element are both on a side of the second substrate away from the light guide layer.

11. The touch sensing structure of claim 1, further comprising a touch element for detecting locations of touches, wherein the touch element is in the light-transmitting area and is on the pressure-sensitive element, and the second reflective layer is between the touch element and the pressure-sensitive element.

12. The touch sensing structure of claim 11, further comprising a light guide layer, wherein the touch element is embedded in the light guide layer.

13. The touch sensing structure of claim 12, further comprising a transparent insulating layer, wherein the insulating layer is between the first substrate and the light guide layer and covers the decoration layer, the light-shielding layer, and the first reflective layer, and the touch element is on a surface of the insulating layer away from the second surface.

14. The touch sensing structure of claim 13, wherein the pressure-sensitive element is adhered to a surface of the second reflective layer away from the second surface.

15. The touch sensing structure of claim 14, wherein the second reflective layer is on a surface of the light guide layer away from the second surface and is opposite to the first reflective layer.

16. The touch sensing structure of claim 14, further comprising a second substrate, wherein the second substrate is on a side of the light guide layer away from the second surface.

17. The touch sensing structure of claim 16, wherein the pressure-sensitive element is on the second substrate, and a trace electrically connected to the pressure-sensitive element is on the second substrate.

18. The touch sensing structure of claim 17, wherein the second reflective layer and the pressure-sensitive element are both in the light guide layer.

19. The touch sensing structure of claim 17, wherein the second reflective layer and the pressure-sensitive element are both on a side of the second substrate away from the light guide layer.

20. An electronic device, comprising:
a main body, and
a touch sensing structure on the main body comprising:
- a first substrate, the first substrate defining a light-transmitting area and a light-shielding area at a periphery of the light-transmitting area, the first substrate having a first surface and a second surface opposite to the first surface;
- a decoration layer on the second surface and in the light-transmitting area, the decoration layer defining a function icon associated with a function;
- an opaque light-shielding layer on the second surface and in the light-shielding area;
- a light-emitting element on a side of the light-shielding layer away from the second surface and in the light-shielding area, the light-emitting element being configured to emit light to illuminate the function icon;
- a pressure-sensitive element on a side of the decoration layer away from the second surface and in the light-transmitting area, the pressure-sensitive element being farther away than the light-emitting element from the first substrate;
- a first reflective layer between the light-shielding layer and the light-emitting element, and in the light-shielding area; and
- a second reflective layer between the light-emitting element and the pressure-sensitive element;

wherein the touch sensing structure is configured to determine a magnitude of a pressing force received by the pressure-sensitive element, by detecting a change in resistance or voltage value of the pressure-sensitive element when the first substrate is pressed; and wherein the touch sensing structure is configured to execute the function associated with the function icon when the pressing force is greater than a specific value and otherwise not execute the function associated with the function icon.

\* \* \* \* \*